(12) United States Patent
Hoffman

(10) Patent No.: US 8,371,705 B2
(45) Date of Patent: Feb. 12, 2013

(54) MIRRORS AND METHODS OF MAKING SAME

(75) Inventor: Robert Clinton Hoffman, Woodstock, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1373 days.

(21) Appl. No.: 12/046,228

(22) Filed: Mar. 11, 2008

(65) Prior Publication Data

US 2009/0231738 A1  Sep. 17, 2009

(51) Int. Cl.
*G02B 5/08* (2006.01)
*B05D 5/06* (2006.01)

(52) U.S. Cl. ........ 359/839; 359/900; 427/164; 427/165; 427/166

(58) Field of Classification Search .................. 427/164, 427/165, 166, 255.33; 359/900, 839; 117/54, 117/105
See application file for complete search history.

(56) References Cited

U.S. PATENT DOCUMENTS

| | | | | |
|---|---|---|---|---|
| 2,588,569 A * | 3/1952 | Picard | ............................. | 264/21 |
| 3,010,841 A | 11/1961 | Heard et al. | | |
| 3,578,843 A * | 5/1971 | Castellion | ..................... | 359/267 |
| 3,619,283 A * | 11/1971 | Carpenter et al. | ............ | 117/109 |
| 3,725,135 A * | 4/1973 | Hager et al. | .................... | 438/509 |
| 3,902,924 A * | 9/1975 | Maciolek et al. | ............. | 257/614 |
| 3,969,545 A * | 7/1976 | Slocum | ....................... | 427/163.1 |
| 4,108,539 A | 8/1978 | Gort et al. | | |
| 4,190,327 A | 2/1980 | Hughes | | |
| 4,263,065 A * | 4/1981 | Wang et al. | ...................... | 117/58 |
| 4,390,240 A | 6/1983 | Bookbinder | | |
| 4,401,487 A * | 8/1983 | Lockwood | ....................... | 117/67 |
| 4,474,640 A * | 10/1984 | Wan | ................................ | 117/55 |
| 4,545,646 A | 10/1985 | Chern et al. | | |
| 4,566,918 A * | 1/1986 | Irvine et al. | ................... | 438/509 |
| 4,582,389 A | 4/1986 | Wood | | |
| 4,601,533 A | 7/1986 | Moss | | |
| 4,637,678 A | 1/1987 | Moss | | |
| 4,642,142 A * | 2/1987 | Harman | ........................ | 438/502 |

(Continued)

FOREIGN PATENT DOCUMENTS

| | | | |
|---|---|---|---|
| GB | 2156857 | * | 10/1985 |
| JP | 55-109296 | * | 8/1980 |

(Continued)

OTHER PUBLICATIONS

Hadsund, P., "The Tin-mercury Mirror: Its Manufacturing Technique and Deterioration Processes," Studies in Conservation, vol. 38, No. 1, Feb. 1993.

(Continued)

*Primary Examiner* — Ricky D Shafer
(74) *Attorney, Agent, or Firm* — Lawrence E. Anderson; Eric B. Compton

(57) ABSTRACT

A mirror having a first substrate and a reflective film formed on the first substrate, the reflective film made of mercury and at least one metal, wherein the mirror is operative such that light incident upon the first substrate and having an intensity that falls below a fluence threshold is reflected by the reflective film, and light incident upon the first substrate and having an intensity that exceeds the fluence threshold passes through the reflective film.

19 Claims, 3 Drawing Sheets

U.S. PATENT DOCUMENTS

| | | | |
|---|---|---|---|
| 4,669,810 A | 6/1987 | Wood | |
| 4,687,720 A | 8/1987 | Wreede et al. | |
| 4,707,054 A | 11/1987 | Howard | |
| 4,786,125 A | 11/1988 | Magarinos et al. | |
| 4,815,800 A | 3/1989 | Chern et al. | |
| 4,826,290 A | 5/1989 | Wreede et al. | |
| 4,830,441 A | 5/1989 | Chang | |
| 4,853,306 A | 8/1989 | Wreede et al. | |
| 4,863,225 A | 9/1989 | Howard | |
| 4,874,214 A | 10/1989 | Cheysson et al. | |
| 4,879,167 A | 11/1989 | Chang | |
| 4,921,344 A * | 5/1990 | Duplantis | 396/16 |
| 4,936,653 A * | 6/1990 | Schemmel et al. | 359/580 |
| 4,968,117 A | 11/1990 | Chern et al. | |
| 4,978,182 A | 12/1990 | Tedesco | |
| 4,983,003 A | 1/1991 | Wreede et al. | |
| 5,052,765 A | 10/1991 | Moss et al. | |
| 5,171,414 A | 12/1992 | Amberger et al. | |
| 5,179,630 A | 1/1993 | Chang et al. | |
| 5,212,585 A | 5/1993 | Ning | |
| 5,276,537 A | 1/1994 | Savant et al. | |
| 5,327,266 A | 7/1994 | Mulder et al. | |
| 5,398,641 A * | 3/1995 | Shih | 117/101 |
| 5,399,503 A * | 3/1995 | Saito et al. | 438/479 |
| 5,448,582 A | 9/1995 | Lawandy | |
| 5,499,118 A | 3/1996 | Wreede et al. | |
| 5,587,847 A | 12/1996 | Chang et al. | |
| 5,612,800 A | 3/1997 | Braatz et al. | |
| 5,625,456 A | 4/1997 | Lawandy | |
| 5,825,790 A | 10/1998 | Lawandy | |
| 5,923,456 A * | 7/1999 | Tench et al. | 359/266 |
| 5,943,354 A | 8/1999 | Lawandy | |
| 6,130,753 A | 10/2000 | Hopkins | |
| 6,344,272 B1 | 2/2002 | Oldenburg et al. | |
| 6,411,451 B1 | 6/2002 | Fliss et al. | |
| 6,510,263 B1 | 1/2003 | Maisenholder et al. | |
| 6,637,877 B1 | 10/2003 | Hartley et al. | |
| 6,685,986 B2 | 2/2004 | Oldenburg et al. | |
| 6,701,681 B2 | 3/2004 | Kim | |
| 6,899,437 B2 | 5/2005 | Bauer | |
| 6,923,537 B2 | 8/2005 | Hartley et al. | |
| 7,008,056 B2 | 3/2006 | Hartley | |
| 7,022,210 B2 * | 4/2006 | Tench | 204/290.14 |
| 7,196,794 B2 | 3/2007 | Wu et al. | |

FOREIGN PATENT DOCUMENTS

| | | |
|---|---|---|
| JP | 05-339095 * | 12/1993 |
| WO | WO 88/01230 | 2/1988 |

OTHER PUBLICATIONS

Wehner, J.G., "Mercury Cadmium Telluride/Cadmium Telluride Distributed Bragg Reflectors," Optoelectronic and Microelectronic Materials and Devices, 2004 Conference on Issue Date Dec. 6-8, 2004, pp. 189-192.

\* cited by examiner

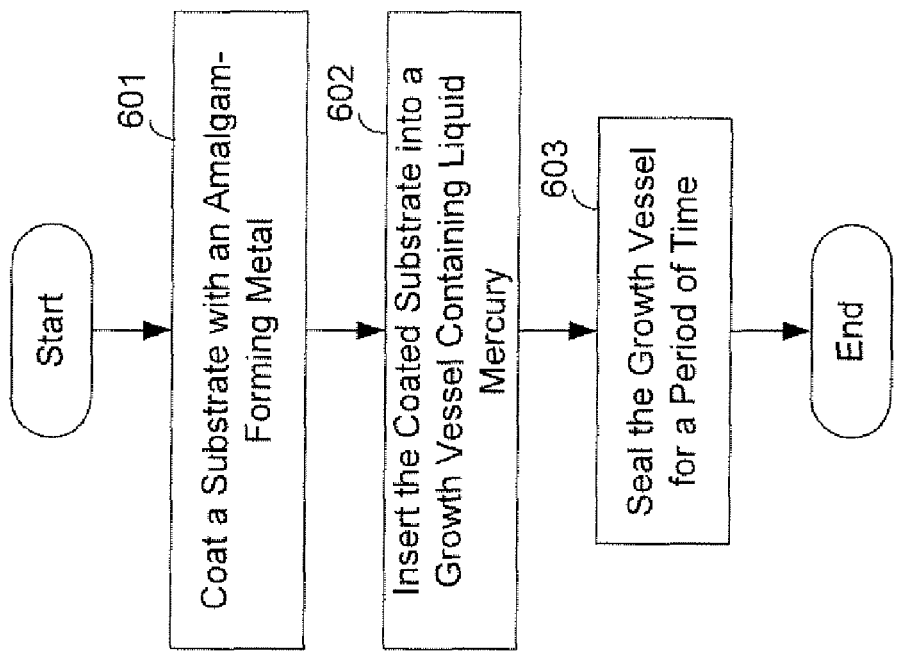

MIRRORS AND METHODS OF MAKING SAME

GOVERNMENT INTEREST

The invention described herein may be manufactured, used, and licensed by or for the United States Government.

TECHNICAL FIELD the present disclosure generally relates to mirrors, and more particularly relates to mirrors that reflect incident light based upon the intensity of the incident light.

BACKGROUND

Typically, a mirror comprises a sheet of glass that is coated on its backside with a metal, e.g., silver or aluminum. When light is incident upon the mirror, the metal coating reflects the light thereby producing images by reflection to one who is looking into the mirror.

Such mirrors are typically manufactured by sputtering a thin layer of aluminum or silver onto the back of the glass when the glass is in a vacuum. Alternatively, some mirrors are made by evaporating the aluminum or silver onto the front of the glass.

In the past, some mirrors were made with a tin amalgam. In this regard, a piece of glass was placed over tin foil covered with liquid mercury. The tin and the mercury created a reflective coating made up of a part solid and part fluid phase of the tin amalgam.

SUMMARY

The present disclosure generally relates to mirrors and methods for making such mirrors.

It is an object of the present invention to provide a passive mirror capable of blocking the reflection of harmful optical transients of visible light to protect the eye of a viewer.

It is still another object of the present invention to provide a passive mirror that blocks the reflection of optical transients exceeding a fluence threshold by a destructive absorption process.

It is still another object of the invention to make a thin film reflective material having a low boiling point.

A representative embodiment of a mirror in accordance with the present disclosure comprises a first substrate and a reflective film. The reflective film is formed on the first substrate and comprises mercury and at least one metal, wherein the mirror is operative such that light incident upon the first substrate and having a fluence that falls below a threshold is reflected by the reflective film, and light incident upon the first substrate and having a fluence that exceeds the threshold passes through the reflective film.

A representative embodiment of a method in accordance with an embodiment of the present disclosure can be broadly summarized by the following steps: coating a first substrate with an amalgam-forming metal, suspending the coated substrate in a growth vessel, the growth vessel containing liquid mercury, and sealing the growth vessel until a reflective amalgam film forms on the first substrate.

Other systems, methods, features, and advantages of the present disclosure will be or may become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 6 is flowchart depicting an exemplary method of making the mirror depicted in FIG. 1.

DETAILED DESCRIPTION

The present disclosure generally relates to mirrors and methods for making mirrors. In this regard, an embodiment of a mirror comprises an amalgam film on a transparent substrate. The mirror is operative such that, when light exhibiting a fluence that exceeds a threshold is incident upon the mirror, the amalgam reaches its boiling point. At its boiling point, the amalgam disintegrates thereby allowing the light to propagate through the mirror. In contrast, any light incident upon the mirror that exhibits a fluence that does not exceed the fluence threshold is reflected. Note that fluence is a measure of energy per unit area, such as Joules/centimeter$^2$.

Furthermore, the present disclosure relates to methods for making such a mirror. In this regard, a transparent substrate coated with an amalgam-forming metal is suspended within a cavity of a container that is housing liquid mercury (Hg). The container is sealed, and mercury vapor emitted from the liquid mercury reacts with the amalgam-forming metal thereby generating a reflective film on the transparent substrate. In one embodiment, an inert gas atmosphere of nitrogen or argon in the cavity of the container should prevent oxidation of the mercury. Notably, the metal selected for such reaction is preferably a low boiling point metal, e.g., a metal having a boiling point relatively near the boiling point of liquid mercury. Thus, when light having a fluence exceeding the particular threshold described herein is incident upon the mirror, the mirror allows the light to be transmitted as opposed to reflecting the light.

Figure 1:
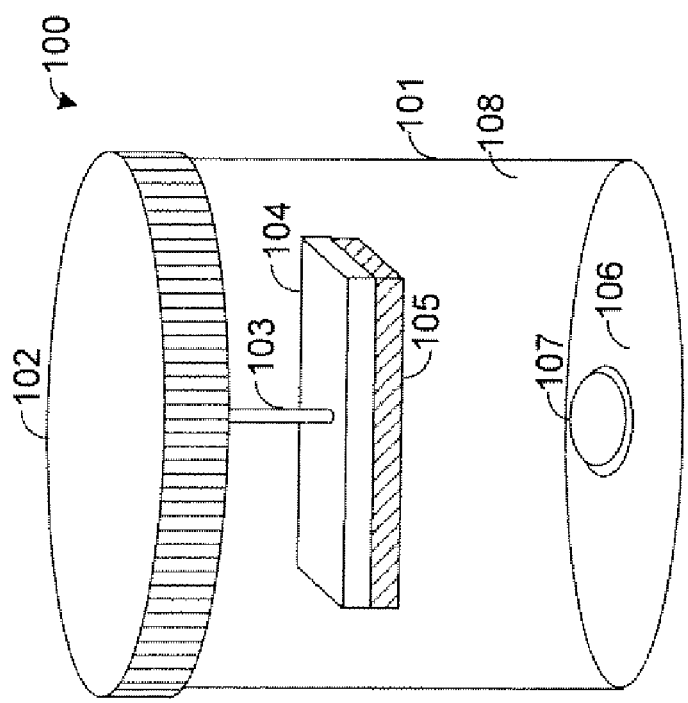
FIG. 1 is a perspective view of an exemplary growth vessel for making a mirror in accordance with an embodiment of the present disclosure.

FIG. 1 is a perspective view of a growth vessel 100 in accordance with an embodiment of the present disclosure. The growth vessel 100 comprises a container 101 that forms a hollow cavity 108. The growth vessel 100 further comprises a removable lid 102. When the lid 102 is coupled to the container 101, the hollow cavity 108 is substantially sealed via the removable lid 102.

Note that the growth vessel 100 depicted in FIG. 1 is cylindrically shaped. However, containers having alternative shapes are possible in other embodiments. For example, the growth vessel 100 may be a square or rectangular.

The removable lid 102 is coupled to a substrate holder 103. The substrate holder 103 extends from the lid 102 and into the container 101 when the lid 102 is coupled to the container 101. The substrate holder 103 is further coupled to a substrate 104. The substrate 104 is preferably transparent and may be, for example, a piece of glass.

A layer of amalgam-forming metal 105, hereinafter referred to as "seed layer 105," is deposited on the substrate 104 prior to suspending the substrate 104 in the cavity 108. The seed layer 105 may comprise, for example, silver (Ag), gold (Au), or cadmium (Cd). The seed layer 105 is preferably a thin metal film exhibiting an exemplary approximate thickness of 30-400 nanometers (nm). The seed layer 105 may be formed on the substrate 104 via a vacuum evaporation process, a sputtering process, or any other known or future-developed process for depositing the seed layer 105 on the substrate 104.

Further, note that the term "amalgam" refers to an alloy of mercury and at least one other metal. For example, the amalgam may contain mercury and gold, mercury and silver, or mercury and cadmium. As described further herein, the metal selected for seed layer 105 preferably has a boiling point that is substantially close to mercury.

In addition, a drop of liquid mercury 107 is placed within the container body 101. As is depicted in FIG. 1, the drop of liquid mercury 107 may be deposited on a floor 106 of the container body 101. In this regard, because mercury has a significant partial pressure at 25° C., metal may react with mercury vapor produced by the liquid mercury 107 deposited on the floor 106 of the container 101. Note that at 25° C. the vapor pressure of mercury is $1.7 \times 10^{-2}$ torr and at 100° C. it is 0.25 torr. "Torr" refers to the atmospheric pressure that supports a column of mercury one-millimeter high. As the temperature increases, the growth rate of the amalgam film increases and the resulting mirror may exhibit poor quality.

Figure 2:
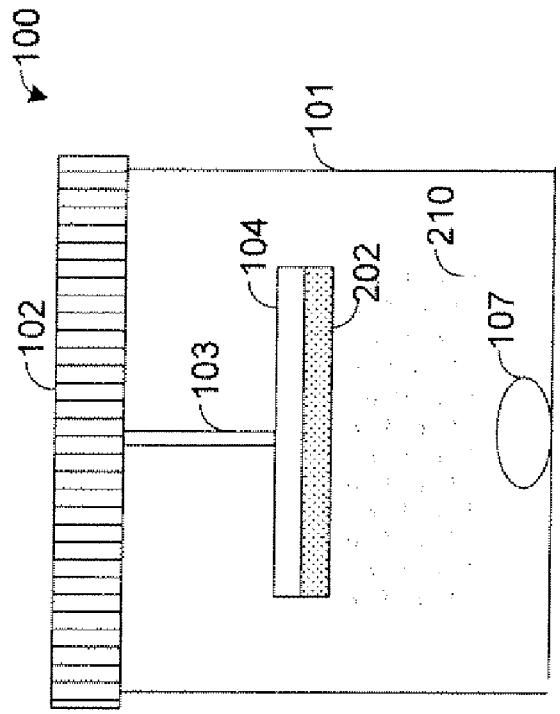
FIG. 2 is a side plan view of the growth vessel depicted in FIG. 2.

FIG. 2 depicts a side plan view of the growth vessel 100 depicted in FIG. 1. As indicated hereinabove, when the lid 102 is secured to the container 101, the substrate holder 103 extends into the container 101. Thus, the substrate 104 coupled to the substrate holder 103 is suspended within the cavity 108 formed by the container 101.

Note that mercury is liquid at room temperature. Furthermore, mercury evaporates at room temperature emitting colorless, odorless mercury vapors. Thus, when the cavity 108 is sealed, the growth vessel 100 contains mercury vapors 210 emitted from the liquid mercury 107. When the mercury vapors 210 are contained within the cavity 108 by the lid 102, the mercury vapors 210 react with the amalgam-forming metal seed layer 105 (FIG. 1) thereby forming a reflective amalgam film layer 202. The amount of the mercury in the reflective amalgram film can vary between zero and 50 atomic percent thereof.

Liquid mercury (Hg) reacting with the metal (M) seed layer 105 to form an amalgam film may be represented by the following equation:

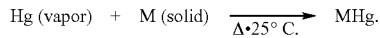

The reflective amalgam film layer 202 exists in mercury vapor phase equilibrium thereby rendering the film 202 stable. In this regard, after a period of time, e.g., a 24-hour period, the film 202 is formed within the container 101 and equilibrium is reached. When such equilibrium is reached, the amalgam film layer 202 and the substrate 104 reflect incident light that is below a fluence threshold and transmits light that exceeds the fluence threshold.

In this regard, the metal selected for the seed layer 105 preferably exhibits a mid-range to low boiling point. For example, the metal selected for the seed layer 105 may be gold (Au) having a boiling point of 2807° C., silver (Ag) having a boiling point of 2212° C., or cadmium (Cd) having a boiling point of 765° C. In this regard, mercury exhibits a boiling point of 356.58° C. Thus, when light incident to the reflective amalgam film 202 exceeds the fluence threshold, e.g., 0.5 µJ/cm² (microJoules/centimeter²), the light does not reflect off the film 202. In the case of cadmium as the seed layer, the cadmium film itself may act as a threshold mirror when no mercury is present, i.e. the atomic fraction of mercury present is zero.

Instead, the incident light strikes a portion of the amalgam film 202, the mercury within that portion of the amalgam film 202 reaches its boiling point, and the mercury portion of the film 202 mercury evaporates thereby allowing the light to pass through the film 202. Therefore, light having a fluence that exceeds the threshold value damages the amalgam film 202, and light incident upon that portion that has been damaged previously is no longer reflected. This aspect is described hereinafter with reference to FIGS. 3-5.

Figure 3:
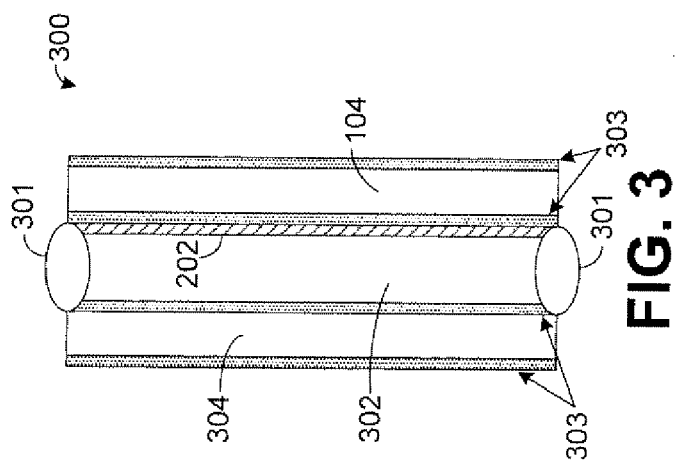
FIG. 3 is an exemplary mirror created using the growth vessel depicted in FIGS. 1 and 2.

FIG. 3 depicts a mirror 300 in accordance with an embodiment of the present disclosure. The mirror 300 comprises the substrate 104 and the reflective amalgam film 202 created via the mercury and metal reaction described hereinabove with reference to FIGS. 1 and 2.

The mirror 300 further comprises a second transparent substrate 304. In this regard, the substrate 104 is coupled to the second transparent substrate 304 via a sealant 301. Such sealant 301 may comprise, for example, an epoxy or silicone resin for sealing an air or inert gas gap 302 formed when the substrates 104 and 304 are coupled one to the other.

Note that the second transparent substrate 304 may be, for example, a piece of glass. Further, note that in one embodiment, the substrates 104 and 304 are coated with an anti-reflection coating 303 such that undesired light does not reflect off the transparent substrates 104 and 304. Instead, light is reflected off the amalgam film 202.

Figure 4:
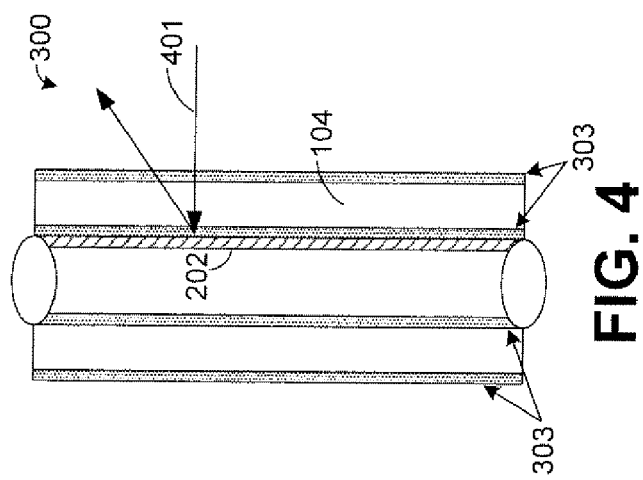
FIG. 4 depicts the mirror of FIG. 3 and light incident upon the reflective amalgam film.

FIG. 4 depicts the mirror 300 and light 401 incident upon the reflective amalgam film 202. As described hereinabove, the reflective amalgam film 202 comprises mercury (Hg) having a boiling point of 356.56° C. and a relatively low-boiling point metal (M).

In this regard, when the light 401 exhibits an intensity that falls below a fluence threshold, e.g., 0.5 µJ/cm², the intensity of the light 401 is not sufficient to change the phase of the mercury or the metal in the amalgam film 202. Thus, the film 202 reflects the light 401 as indicated.

Figure 5:
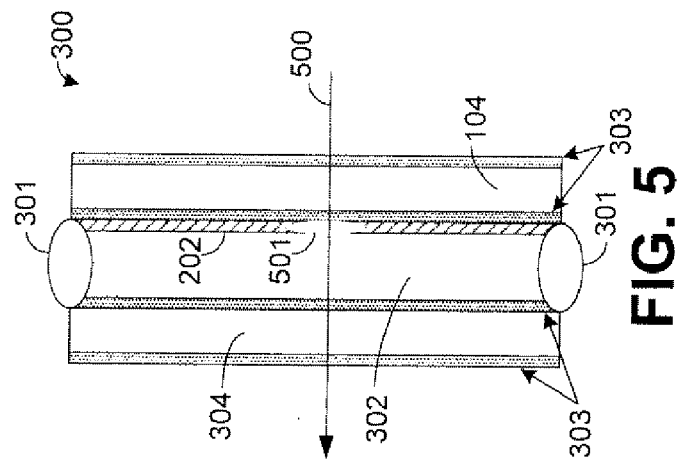
FIG. 5 depicts light falling incident to the mirror depicted in FIG. 3 when the intensity of the incident light exceeds the threshold.

FIG. 5 depicts the mirror 300 and light 500 incident upon the reflective amalgam film 202. However, FIG. 5 depicts light 500 having a fluence that exceeds the threshold, as described hereinabove. When the fluence threshold is exceeded, the intensity of the light 500 is sufficient to raise the temperature of the mercury in the amalgam film 202 to the mercury's boiling point. At its boiling point, the mercury evaporates.

Further, if the intensity of the light 500 exceeds the above-referenced fluence threshold, e.g., 0.5 µJ/cm², the light 500 exhibits intensity sufficient to change the phase of the mercury and/or the metal in the amalgam film 202. When such change occurs, the mercury and/or the metal in the amalgam film 202 reaches their boiling points, and a portion 501 of the film 202 is damaged, i.e., the mercury boils away and no longer reflects. When that portion 501 is damaged, that portion of the film no longer reflects the light, as described with reference to FIG. 4. Instead, the light 500 passes through the anti-reflection coatings 303, the substrate 104, the damaged portion 501, the air gap 302, and the second substrate 304. Thus, at least a portion of the light 500 incident upon the mirror 300 is not reflected.

FIG. 6 depicts an exemplary method of making a mirror 300 in accordance with an embodiment of the present disclosure. In this regard, a user (not shown) coats a substrate 104 (FIG. 1) with an amalgam-forming metal layer 105 (FIG. 1), as indicated in step 601. As described herein, the metal layer 105 is preferably a relatively low-boiling point metal, e.g., but not limited to gold, silver, or cadmium.

The user inserts the transparent substrate 104 (FIG. 104) that is coated with the amalgam-forming metal layer 105 in a growth vessel 100 (FIG. 1) containing liquid mercury, as indicated in step 602. Further, the user seals the container 101 (FIG. 1) and leaves the substrate 104 in the container 101 for a period of time, e.g., 24 hours, as indicated in step 603.

Therefore, at least the following is claimed:

1. A mirror, comprising:
a first substrate; and
a reflective film formed on the first substrate, the reflective film comprising mercury and at least one metal, wherein the amount of the mercury in the reflective film is between zero and 50 atomic percent thereof,
wherein the mirror is operative such that light incident upon the first substrate having an intensity that falls below a fluence threshold is reflected by the reflective film, and light incident upon the first substrate having an intensity that exceeds the fluence threshold causes a portion of the reflective film to evaporate so as to allow subsequent light to pass through the portion of the reflective film.

2. The mirror of claim 1, wherein the metal is one of a group consisting of silver, gold, and cadmium.

3. The mirror of claim 1, wherein the fluence threshold is 0.5 μJ/cm$^2$.

4. The mirror of claim 1, wherein the reflective film is between 100 and 400 nanometers in thickness.

5. The mirror of claim 1, further comprising a second substrate coupled to the first substrate such that a gap is formed between the first and second substrates.

6. The mirror of claim 5, wherein a gas is located in the gap.

7. The mirror of claim 5, wherein the mirror is operative such that the light incident upon the first substrate travels through the first substrate and reflects off the reflective film if the intensity of the light is below the fluence threshold.

8. The mirror of claim 5, wherein the mirror is operative such that the light incident upon the first substrate travels through the first substrate and through the portion of the evaporated reflective film.

9. The mirror of claim 1, wherein the mirror is adapted to be used in an optical device as a safety measure such that when the intensity of light incident upon the mirror exceeds the fluence threshold, the reflective film boils such that the light passes through the substrate and is not reflected into eyes of a user.

10. A method of using the mirror of claim 1, comprising:
protecting eyes of a viewer, such that when light exceeding the fluence threshold is incident upon the mirror, the portion of the reflective film reaches its boiling point and becomes damaged.

11. A method of making a mirror, comprising the steps of:
coating a first substrate with an amalgam-forming metal;
suspending the coated substrate in a growth vessel, the growth vessel containing liquid mercury; and
sealing the growth vessel and allowing the mercury to evaporate, wherein the evaporated mercury reacts with the metal such that a reflective amalgam film forms on the first substrate,
the reflective amalgam film formed being configured to reflect incident light thereto having an intensity below a fluence threshold and to evaporate a portion thereof when light incident thereto has an intensity that exceeds the fluence threshold so as to allow subsequent light to pass through the portion of the reflective film.

12. The method of claim 11, wherein the step of coating the first substrate with the amalgam-forming metal comprises: coating the first substrate with a seed layer comprising one of the metals from a group consisting of silver, and cadmium, the seed layer having approximate thickness of 30-400 nanometers.

13. The method of claim 12, further comprising regulating a temperature within the growth vessel to approximately 25° C. when the reflective film is growing.

14. The method of claim 11, wherein the sealing step further comprises sealing the growth vessel for at least 24 hours.

15. The method of claim 11 wherein the sealing step further comprises the step of sealing the growth vessel until the reflective amalgam film is between 100 and 400 nanometers.

16. The method of claim 11, further comprising coupling the first substrate to a second substrate.

17. A mirror produced by the method of claim 11 comprising:
the first substrate; and
the reflective amalgam film formed on the first substrate, wherein the amount of the mercury in the reflective amalgam film is between zero and 50 atomic percent thereof.

18. The mirror of claim 17 wherein the substrate comprises an anti-reflection coating and wherein the fluence threshold is 0.5 μJ/cm2 and when the light incident exceeds the fluence threshold the portion of the reflective amalgam film boils and disintegrates such that the first substrate allows the subsequent light to pass through the first substrate.

19. The mirror of claim 17 wherein the mirror further comprises a second substrate coupled to the first substrate such that a gap is formed between the first and second substrates.

* * * * *